(12) United States Patent
Lee et al.

(10) Patent No.: US 9,519,220 B2
(45) Date of Patent: Dec. 13, 2016

(54) METHOD, PHOTOLITHOGRAPHY METHOD, AND METHOD OF MANUFACTURING A SEMICONDUCTOR DEVICE USING A PELLICLE FILM

(71) Applicants: Su-Young Lee, Seongnam-si (KR); Tae-Geun Kim, Hwaseong-si (KR); Jong-Gul Doh, Hwaseong-si (KR)

(72) Inventors: Su-Young Lee, Seongnam-si (KR); Tae-Geun Kim, Hwaseong-si (KR); Jong-Gul Doh, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/706,980

(22) Filed: May 8, 2015

(65) Prior Publication Data

US 2016/0048079 A1 Feb. 18, 2016

(30) Foreign Application Priority Data

Aug. 12, 2014 (KR) ........................ 10-2014-0104482

(51) Int. Cl.
*H01L 21/00* (2006.01)
*G03F 7/20* (2006.01)

(52) U.S. Cl.
CPC .................................. *G03F 7/2004* (2013.01)

(58) Field of Classification Search
CPC ................ G03F 1/62; G03F 1/24; G03F 1/64; G03F 1/142; B82Y 10/00; B82Y 40/00; Y10T 428/265; Y10T 428/24917; Y10T 428/24975;B32B 27/06; B32B 5/18; C08J 5/04; C23C 14/48; C23C 16/01

See application file for complete search history.

(56) References Cited

U.S. PATENT DOCUMENTS

| | | | |
|---|---|---|---|
| 6,594,073 B2 | 7/2003 | Wang | |
| 6,623,893 B1 | 9/2003 | Levinson et al. | |
| 7,153,615 B2 | 12/2006 | Bristol et al. | |
| 7,604,904 B2 | 10/2009 | Nagata | |
| 7,666,555 B2 | 2/2010 | Goldstein et al. | |

(Continued)

FOREIGN PATENT DOCUMENTS

| | | |
|---|---|---|
| JP | 2010-256434 A | 11/2010 |
| JP | 2012-151158 A | 8/2012 |

(Continued)

*Primary Examiner* — Robert Bachner
(74) *Attorney, Agent, or Firm* — Muir Patent Law, PLLC

(57) ABSTRACT

A pellicle for an EUV lithography may include a pellicle film, a supporting structure and a handling block. The pellicle film may have a first surface for orienting opposite to a mask, and a second surface opposite to the first surface and for orienting toward the mask. The pellicle film may allow the EUV, which may pass through the mask, to penetrate the pellicle film. The supporting structure may be arranged on the second surface of the pellicle film to support the pellicle film. The handling block may be arranged on the first surface of the pellicle film. The handling block may have an opening configured to expose the pellicle film. Thus, the pellicle may be handled using the thick handling block, not the thin pellicle film, so that the thin pellicle film may not be damaged. The pellicle may protect the mask from byproducts generated in the EUV lithography process so that the mask may not be contaminated.

19 Claims, 23 Drawing Sheets

(56) References Cited

U.S. PATENT DOCUMENTS

| | | |
|---|---|---|
| 7,901,846 B2 | 3/2011 | Kubota et al. |
| 7,919,217 B2 | 4/2011 | Kubota et al. |
| 7,951,513 B2 | 5/2011 | Kubota et al. |
| 8,518,612 B2 | 8/2013 | Akiyama et al. |
| 8,535,545 B2 | 9/2013 | Kim |
| 2005/0025959 A1 | 2/2005 | Bellman |
| 2012/0183757 A1 | 7/2012 | Akiyama et al. |

FOREIGN PATENT DOCUMENTS

| | | | |
|---|---|---|---|
| JP | 2013-257373 A | 12/2013 | |
| KR | 10-0849714 B | 8/2008 | |

METHOD, PHOTOLITHOGRAPHY METHOD, AND METHOD OF MANUFACTURING A SEMICONDUCTOR DEVICE USING A PELLICLE FILM

CROSS-RELATED APPLICATION

This application claims priority under 35 USC §119 to Korean Patent Application No. 10-2014-0104482, filed on Aug. 12, 2014 in the Korean Intellectual Property Office (KIPO), the contents of which are herein incorporated by reference in their entirety.

BACKGROUND

The present disclosure relates to a pellicle and to using a pellicle film. More particularly, example embodiments relate to a pellicle film used for manufacturing a semiconductor device in an extreme ultraviolet (EUV) lithography process.

Generally, a reflective optical system and a reflective mask may be used in a lithography process using an EUV. In order to prevent the reflective mask from being contaminated, a pellicle may protect the reflective mask.

According to related art, a pellicle may include a pellicle film and a supporting structure. The pellicle film may allow the EUV to pass through the pellicle film. The supporting structure may be configured to support the pellicle film. The pellicle film may have a very thin thickness for allowing the EUV having a short wavelength to pass through the pellicle film. Because the very thin pellicle film may not be easily handled, uses of the pellicle in the EUV lithograph process may be restricted.

SUMMARY

Example embodiments provide a pellicle for an EUV lithography that may be capable of being more easily handled.

Example embodiments also provide a method of manufacturing the above-mentioned a pellicle for an EUV lithography, and a method of manufacturing a semiconductor device using a pellicle film.

According to example embodiments, there may be provided a pellicle for an EUV lithography. The pellicle may include a pellicle film, a supporting structure and a handling block. The pellicle film may have a first surface opposite to a mask, and a second surface opposite to the first surface and oriented toward the mask. The pellicle film may allow the EUV, which may pass through the mask, to penetrate the pellicle film. The supporting structure may be arranged on the second surface of the pellicle film to support the pellicle film. The handling block may be arranged on the first surface of the pellicle film. The handling block may have an opening configured to expose the pellicle film.

In example embodiments, the pellicle film may have a thickness of about 30 nm to about 100 nm.

In example embodiments, the pellicle film may include silicon.

In example embodiments, the supporting structure may include a supporting pattern arranged on a central portion of the pellicle film exposed through the opening, and a supporting block arranged on an edge portion of the pellicle film. The supporting block may be connected to the supporting pattern.

In example embodiments, the supporting block may have a width between inner side surfaces of the supporting block shorter than a width of the opening.

In example embodiments, the supporting pattern may have a honeycomb structure.

In example embodiments, the supporting pattern may have a mesh structure.

In example embodiments, the supporting structure may have a thickness of about 1 μm to about 50 μm.

In example embodiments, the opening may have a first width configured to determine an exposed area of the pellicle film, and a second width configured to determine an entrance area of the opening. The second with may be wider than the first width.

In example embodiments, the opening may have a gradually increased width from the first width to the second width.

In example embodiments, the supporting structure may include silicon.

In example embodiments, the pellicle may further include a first etch stop layer interposed between the handling block and the pellicle film.

In example embodiments, the first etch stop layer may include silicon oxide, silicon nitride, etc.

In example embodiments, the pellicle may further include a second etch stop layer interposed between the supporting structure and the pellicle film.

In example embodiments, the second etch stop layer may include silicon oxide, silicon nitride, etc.

In example embodiments, the pellicle may further include an etch mask arranged on the handling block.

According to example embodiments, there may be provided a pellicle for an EUV lithography. The pellicle may include a pellicle film, supporting structures, a handling substrate, a first etch stop layer and a second etch stop layer. The pellicle film may have a first surface opposite to a mask, and a second surface opposite to the first surface and oriented toward the mask. The pellicle film may allow the EUV, which may pass through the mask, to penetrate the pellicle film. The supporting structures may be arranged on the second surface of the pellicle film to support the pellicle film. The handling substrate may be arranged on the first surface of the pellicle film. The handling substrate may have openings configured to expose the pellicle film. The first etch stop layer may be interposed between the handling substrate and the pellicle film. The second etch stop layer may be interposed between each of the supporting structures and the pellicle film.

In example embodiments, each of the supporting structures may include a supporting pattern arranged on a central portion of the pellicle film exposed through the opening, and a supporting block arranged on an edge portion of the pellicle film. The supporting block may be connected to the supporting pattern.

In example embodiments, the supporting block may have a width between inner side surfaces of the supporting block shorter than a width of the opening.

In example embodiments, the supporting pattern may have a honeycomb structure.

In example embodiments, the supporting pattern may have a mesh structure.

In example embodiments, the opening may have a first width configured to determine an exposed area of the pellicle film, and a second width configured to determine an entrance area of each of the openings. The second with may be wider than the first width.

In example embodiments, the opening may have a gradually increased width from the first width to the second width.

In example embodiments, the pellicle may further include an etch mask arranged on the handling substrate to determine a width of each of the openings.

According to example embodiments, there may be provided a method of manufacturing a pellicle for an EUV lithography. In the method of manufacturing the pellicle for the EUV lithography, a handling block may be formed on a first surface of a pellicle film oriented toward a mask. The handling block may have an opening configured to expose the pellicle film. A supporting structure configured to support the pellicle film may be formed on a second surface of the pellicle film opposite to the first surface.

In example embodiments, the pellicle film may have a thickness of about 30 nm to about 100 nm.

In example embodiments, the pellicle film may include silicon.

In example embodiments, forming the handling block may include forming a first etch stop layer on the first surface of the pellicle film, forming a handling member on the first etch stop layer, etching the handling member until the first etch stop layer may be exposed to form the opening, and removing the first etch stop layer exposed through the opening.

In example embodiments, forming the handling block may further include forming an etch mask on the handling member, and wet-etching the handling member using the etch mask to form the opening.

In example embodiments, forming the handling block may further include forming protecting layer on the supporting structure, and removing the protecting layer after forming the opening.

In example embodiments, the protecting layer may include a metal.

In example embodiments, the first etch stop layer may be removed by a dry etching process.

In example embodiments, the handling block may include silicon.

In example embodiments, forming the supporting structure may include forming a second etch stop layer on the second surface of the pellicle film, forming a supporting layer on the second etch stop layer, etching the supporting layer until the second etch stop layer may be exposed to form the supporting structure including supporting patterns and supporting blocks, and removing the second etch stop layer exposed through the supporting patterns.

In example embodiments, forming the supporting layer may include attaching a supporting member to the second etch stop layer, and reducing a thickness of the supporting member.

In example embodiments, the supporting layer may have a thickness of about 1 μm to about 50 μm.

In example embodiments, the supporting layer may be etched using an etch mask having a honeycomb structure.

In example embodiments, the supporting layer may be etched using an etch mask having a mesh structure.

According to example embodiments, there may be provided a method of manufacturing a pellicle for an EUV lithography. In the method of manufacturing the pellicle for the EUV lithography, a first etch stop layer may be formed on a handling substrate. A pellicle film may be formed on the first etch stop layer. A second etch stop layer may be formed on the pellicle film. A supporting layer may be formed on the second etch stop layer. The supporting layer may be patterned until the second etch stop layer may be exposed to form a plurality of supporting structures. The second etch stop layer exposed through the supporting structures may be removed. The handling substrate may be etched until the first etch stop layer may be exposed to form openings configured to expose the pellicle film. The first etch stop layer exposed through the openings may be removed.

In example embodiments, forming the supporting layer may include attaching a supporting substrate to the second etch stop layer, and reducing a thickness of the supporting substrate.

In example embodiments, reducing the supporting substrate may include grinding the supporting substrate to provide the supporting layer with a thickness of about 1 μm to about 50 μm.

In example embodiments, the supporting substrate may include silicon.

In example embodiments, forming the openings may include forming an etch mask on the handling substrate, wet-etching the handling substrate using the etch mask until the first etch stop layer may be exposed to form the openings, and dry-etching the first etch stop layer exposed through the openings.

In example embodiments, forming the openings may further include forming protecting layer on the supporting structures, and removing the protecting layer after forming the openings.

In one embodiment, a method includes: providing a semiconductor substrate; providing a mask above the semiconductor substrate; and forming a film structure. Forming the film structure may include: providing a pellicle film having a plate shape that includes a first surface and a second surface opposite the first surface, forming a supporting structure on the first surface of the pellicle film, the supporting structure having a having a mesh pattern, forming a handling structure on the second surface of the pellicle film, the handling structure including a handling substrate with an opening formed therethrough, and removing the handling structure from the pellicle film by performing a cutting operation. The method may additionally include using the mask and the film structure to perform a photolithography process to form patterns on the semiconductor substrate.

In certain embodiments, the method includes using the mask and the film structure to perform extreme ultraviolet (EUV) lithography to pattern the semiconductor substrate.

In certain embodiments, as a result of the cutting operation, an outer side surface of the pellicle film is coplanar with an outer side surface of the supporting structure.

In one embodiment, the method additionally includes: prior to forming the handling structure on the second surface of the pellicle film, forming an etch stop layer on the second surface of the pellicle film.

The method may additionally include: after forming the etch stop layer on the second surface of the pellicle film, forming the handling substrate on the etch stop layer.

The method may yet further include: forming the opening in the handling substrate by performing wet etching; and removing a portion of the etch stop layer formed that corresponds to the opening by performing dry etching.

In one embodiment, prior to the cutting operation, the supporting structure includes a plurality of holes separated by portions of the mesh pattern, and a supporting block surrounding the mesh structure and holes, and the cutting operation cuts through the supporting block.

In one embodiment, prior to the cutting, a width between opposite inner side surfaces of the supporting block is shorter than a width of the opening.

In one embodiment, the method may additionally include, prior to removing the handling structure, moving the pellicle film and supporting structure by handling the handling structure.

In one embodiment, the pellicle film has a thickness of about 30 nm to about 100 nm.

In one embodiment, the pellicle film comprises silicon.

In one embodiment, the supporting structure has a thickness of about 1 μm to about 50 μm.

In one embodiment, the semiconductor substrate is a wafer, and the method further comprises: after performing the photolithography process, cutting the wafer to form a plurality of semiconductor chips.

According to some aspects, a photolithography method includes: providing a semiconductor substrate; providing a mask above the semiconductor substrate; providing a pellicle film having a plate shape that includes a first surface and a second surface opposite the first surface; forming an upper supporting structure on the first surface of the pellicle film, the upper supporting structure having a having a mesh pattern; forming a lower supporting structure on the second surface of the pellicle film; forming an opening in the lower supporting structure to form a lower supporting block; and using the mask with the pellicle film to perform a photolithography process to form patterns on the semiconductor substrate.

In one embodiment, the method further includes: moving the pellicle film and upper supporting structure by handling the lower supporting block; and after the moving, removing the lower supporting block from the pellicle film by performing a cutting operation.

In certain embodiments, the mesh pattern has a honeycomb or square pattern.

According to additional aspects, a method of manufacturing a semiconductor device includes: providing a semiconductor substrate; providing a mask above the semiconductor substrate; and forming a film structure. The film structure may include: a pellicle film having a plate shape that includes a first surface and a second surface opposite the first surface, a supporting structure on the first surface of the pellicle film, the supporting structure having a pattern that includes an array of holes, and a handling substrate on the second surface of the pellicle film, the handling substrate having an opening therethrough. The method may additionally include transmitting ultraviolet light through the mask and through the pellicle film to form patterns on the semiconductor substrate.

In one embodiment, the supporting structure includes a mesh pattern.

In one embodiment, the method additionally includes removing the handling substrate from the pellicle film by using a cutting process.

In one embodiment, the pellicle film has a thickness of about 30 nm to about 100 nm, and the supporting structure has a thickness of about 1 μm to about 50 μm.

BRIEF DESCRIPTION OF THE DRAWINGS

Example embodiments will be more clearly understood from the following detailed description taken in conjunction with the accompanying drawings.

FIG. 1 is a cross-sectional view illustrating a pellicle for an EUV lithography in accordance with example embodiments;

FIG. 2 is an exemplary plan view illustrating the pellicle in FIG. 1;

FIG. 3 is a plan view illustrating a pellicle in accordance with example embodiments;

FIGS. 4 to 11 are cross-sectional views illustrating a method of manufacturing the pellicle in FIG. 1 in accordance with example embodiments;

FIGS. 12 to 14 are cross-sectional views illustrating a method of manufacturing the pellicle in FIG. 1 in accordance with example embodiments;

FIG. 15 is a cross-sectional view illustrating a pellicle for an EUV lithography in accordance with example embodiments;

FIGS. 16 to 23 are cross-sectional views illustrating a method of manufacturing the pellicle in FIG. 15 in accordance with example embodiments;

FIGS. 24 to 26 are cross-sectional views illustrating a method of manufacturing the pellicle in FIG. 15 in accordance with example embodiments;

FIG. 27 is a flow chart depicting a method of manufacturing a semiconductor device using a pellicle film, in accordance with certain example embodiments;

DETAILED DESCRIPTION

Figure 1:
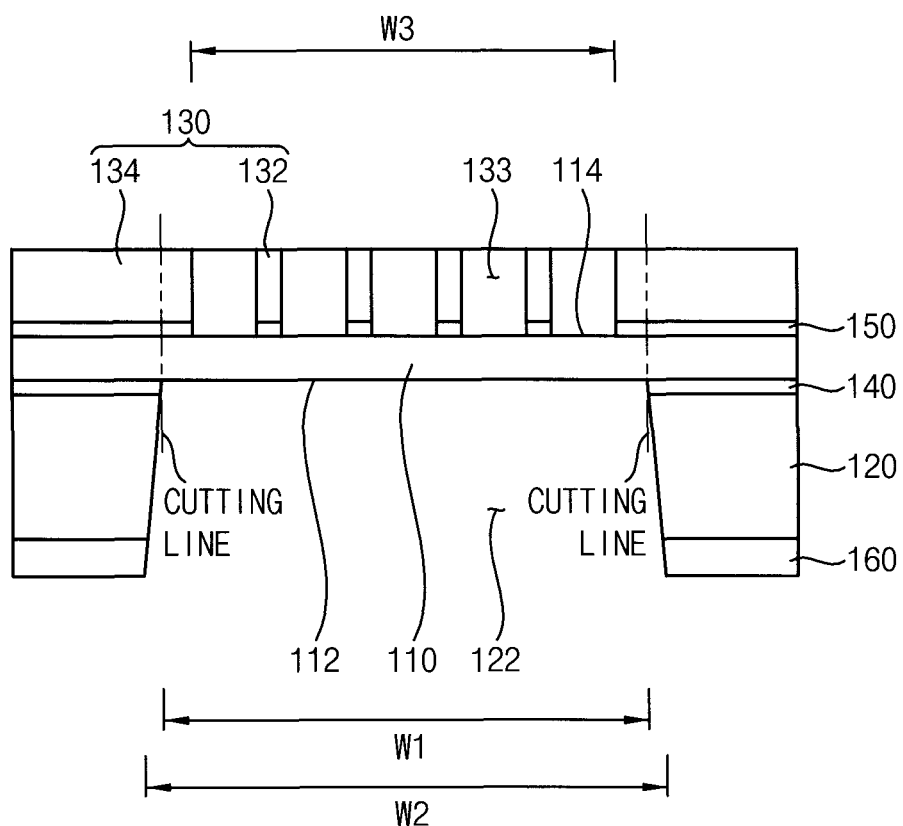
FIGS. 1 to 27 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. In the drawings, the sizes and relative sizes of layers and regions may be exaggerated for clarity, and may not be drawn to scale.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or as "contacting" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section. Thus, a first element, component, region, layer or section discussed below could be termed a second element, component, region, layer or section without departing from the teachings of the present disclosure. For example, the various layers and surfaces described herein may be referred to as first, second, third, etc., layers or surfaces. The name used to refer to one layer or surface in one example (e.g., "first") may be used to refer to a different layer or surface in a different example.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present invention.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
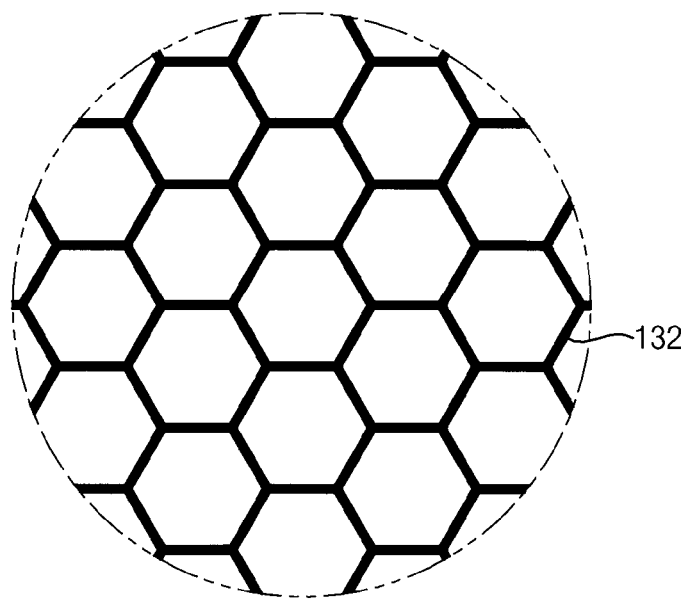
Figure 3:
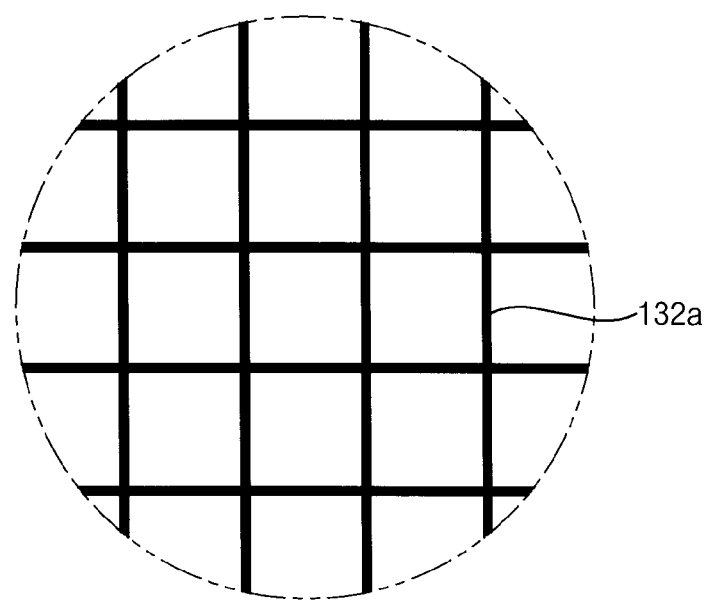
Figure 28:
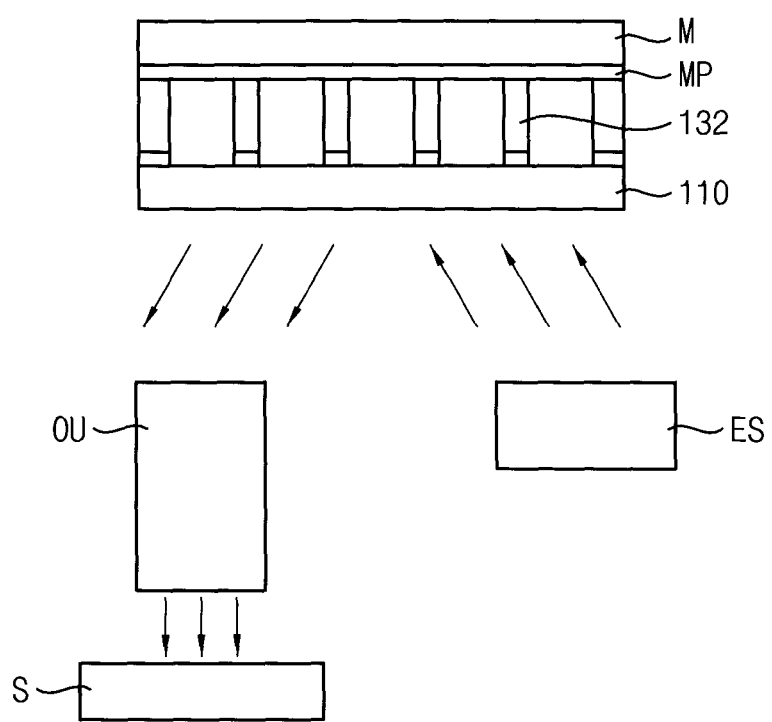
FIG. 28 is a block diagram illustrating an EUV lithography apparatus including the pellicle in FIG. 1 in accordance with example embodiments.

FIG. 1 is a cross-sectional view illustrating a pellicle for an EUV lithography in accordance with example embodiments, FIG. 2 is a plan view illustrating the pellicle in FIG. 1, FIG. 3 is a plan view illustrating a pellicle in accordance with example embodiments, and. FIG. 28 is a block diagram illustrating an EUV lithography apparatus including the pellicle in FIG. 1 in accordance with example embodiments.

Figure 10:
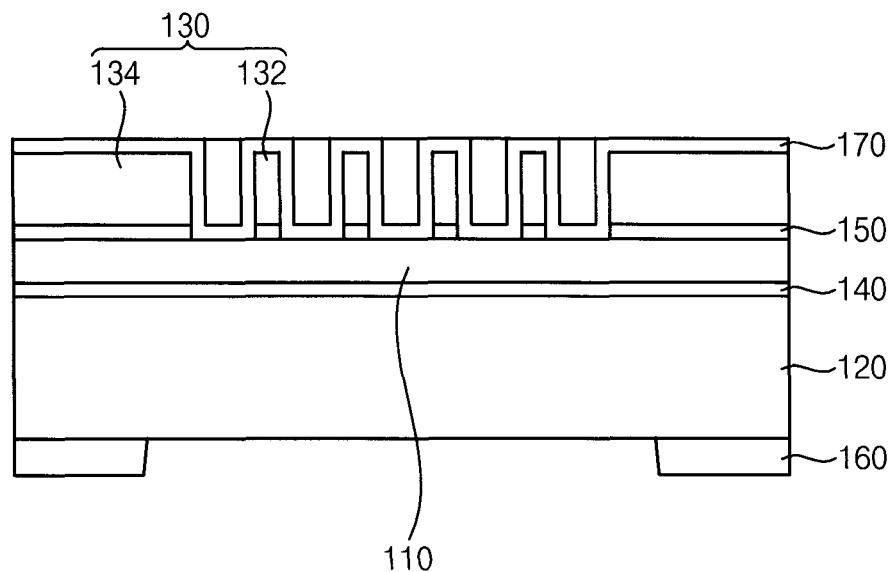
Figure 11:
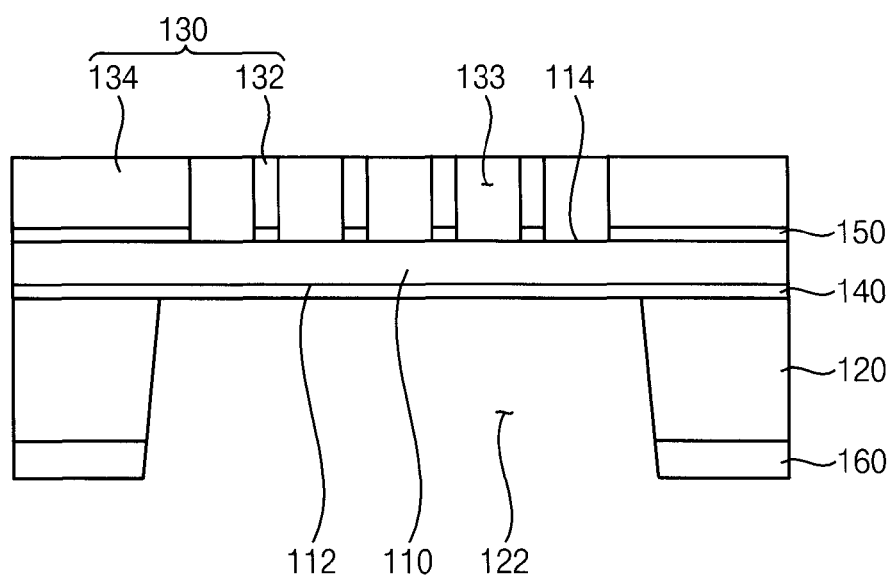

Referring to FIG. 1, a pellicle 100 for an EUV lithography in accordance with this example embodiment may include a pellicle film 110, a handling block 120, a supporting structure 130, a first etch stop layer 140, a second etch stop layer 150 and an etch mask 160. Certain of these components may be referred to using different terminology. For example, component 100 may be referred to herein as a film structure. The term "film structure" may refer to a component 100 such as shown in FIG. 1, and may also refer to other components during other stages of a manufacturing procedure that include a film and parts connected thereto, such as shown in FIG. 10 or 11, or as would occur after a cutting step of FIG. 1.

The pellicle film 110 may prevent a mask from being contaminated by byproducts generated in the EUV lithography process. In one embodiment, the pellicle film 110 has a plate shape. The pellicle film 110 has a first surface 112, which may be opposite to the mask during an EUV lithography process, and a second surface 114 opposite to the first surface 112. Thus, the second surface 114 may be oriented toward the mask. In example embodiments, the first surface 112 may correspond to a lower surface of the pellicle film 110. The second surface 114 may correspond to an upper surface of the pellicle film 110.

The EUV reflected from the mask may penetrate the pellicle film 110. The EUV may be irradiated to a layer on a semiconductor substrate. For example, during a photolithography process, light (e.g., EUV light) may be transmitted through the pellicle film 110 toward a semiconductor substrate, which may be a semiconductor wafer, also referred to as a die. The light may also be transmitted through a mask to which the pellicle film 110 is connected, to form a pattern on the semiconductor substrate. For example, a layer on a semiconductor substrate may be patterned to form a wiring pattern, using the photolithography process. This step may be part of an overall process in forming a semiconductor chip from the wafer. One of more of these semiconductor chips may be later singulated and included in a package or other semiconductor device or electronic device.

Returning to FIG. 1, the pellicle film 110 may include a material for allowing the EUV to penetrate the pellicle film 110. For example, the pellicle film 110 may include silicon. Alternatively, the pellicle film 110 may include other materials for allowing the EUV to penetrate the pellicle film 110 as well as silicon.

The pellicle film 110 may allow the EUV having a short wavelength to penetrate the pellicle film 110 with handleable strength so that the pellicle film 110 has a restricted thickness. For example, when the pellicle film 110 has a thickness of below about 30 nm, the thin pellicle film 110 may be easily broken. In contrast, when the pellicle film 110 has a thickness of above about 100 nm, transmissivity of the EUV through the pellicle film 110 may be decreased. Thus, in certain embodiments, the pellicle film 110 may have a thickness of about 30 nm to about 100 nm.

The handling block 120 may be arranged on the first surface 112 of the pellicle film 110. The handling block 120 may be used for handling the pellicle 100. For example, when the pellicle 100 is moved or transferred, a robot may hold the handling block 120. This may be part of a semiconductor device manufacturing process, as described in more detail below. Thus, when the pellicle 100 is handled, in one embodiment, a physical contact is not applied to the pellicle film 110 itself, so that damage to the pellicle film 110 may be avoided.

The handling block 120 may have an opening 122 configured to expose the first surface 112 of the pellicle film 110. Thus, the handling block 120 may have a shape configured to support an edge portion of the pellicle film 110. For example, the handling block 120 may have a rectangular frame or ring shape. The handling block 120 may include silicon. Alternatively, the handling block 120 may include other materials as well as silicon. The handling block 120 with the opening 122 may also be referred to herein as a lower supporting block. It may be formed of a handling substrate (e.g., Si), and may thus also be referred to as a lower or second supporting substrate. More generally, the handling block 120 may be formed as part of a handling structure, also referred to as a lower supporting structure. As described in more detail below, the lower supporting structure may initially be formed of the lower supporting substrate without the opening 122, and may be later processed to include lower supporting substrate with the opening 122.

The opening 122 may have a first width W1 and a second width W2. The first width W1 may be an upper width of the opening 122 for determining an exposed area of the first surface 112 of the pellicle film 110, and may be a width of the opening 122 closest to the pellicle film 110. The second width W2 may be a lower width of the opening 122 for determining an entrance area of the opening 122. The second width W2 may be wider than the first width W1. Further, the opening 122 may have a gradually decreased width from the second width W2 to the first width W1. Alternatively, the first width W1 may be substantially the same as the second width W2.

The first etch stop layer 140 may be interposed between an upper surface of the handling block 120 and the first surface 112 of the pellicle film 110. The first etch stop layer 140 may have a function as to prevent the pellicle film 110 from being etched by an etching solution in a wet etching process for forming the opening 122 of the handling block 120. Because the handling block 120 may include silicon, the first etch stop layer 140 may include a material that is not removed by the wet etching solution capable of etching silicon. For example, the first etch stop layer 140 may include silicon oxide, silicon nitride, etc. Alternatively, the first etch stop layer 140 may include other materials as well as silicon oxide, silicon nitride, etc. The first etch stop layer 140 may have a thickness, for example, of about 100 nm.

The etch mask 160 may be arranged on a lower surface of the handling block 120. The etch mask 160 may have a function as to determine the second width W2 of the opening 122 in the wet etching process for forming the opening 122 of the handling block 120. Because the handling block 120 may include silicon, the etch mask 160 may include a material that is not removed by the wet etching solution capable of etching silicon. For example, the etch mask 160 may include silicon oxide, silicon nitride, etc. Alternatively, the etch mask 160 may include other materials as well as silicon oxide, silicon nitride, etc. The etch mask layer 160 may have a thickness, for example, of about 50 nm.

The supporting structure 130, also referred to as a first supporting structure, or upper supporting structure, may be arranged on the second surface 114 of the pellicle film 110. The supporting structure 130 may support the pellicle film 110 having the very thin thickness. The supporting structure 130 may include, for example, silicon. Alternatively, the supporting structure 130 may include other materials as well as silicon. In example embodiments, the supporting structure 130 may include a supporting pattern 132 and a supporting block 134.

The supporting pattern 132 may be arranged on a central portion of the second surface 114 of the pellicle film 110. The supporting pattern 132, also referred to as an upper supporting pattern, may have a mesh pattern. For example, the supporting pattern 132 may have a plurality of holes 133 configured to expose the second surface 114 of the pellicle film 110. Portions of the mesh pattern are disposed between the holes. The EUV may pass through the holes 133 between the supporting patterns 132. In one embodiment, in the EUV lithography process, a film structure including the pellicle film 110 and the supporting pattern 132 may be positioned under the mask. Thus, the first surface 112 of the pellicle film 110 may be upwardly oriented. In contrast, the second surface 114 of the pellicle film 110 may be downwardly oriented. Thus, the supporting pattern 132 may support the central portion of the second surface 114 of the pellicle film 110. The supporting structure 130 may include the mesh pattern 132 having a honeycomb structure or pattern in FIG. 2. Alternatively, the supporting structure 130 may include a mesh pattern 132a having a square structure or pattern in FIG. 3. Further, the supporting pattern 132 may have other structures in addition to the honeycomb structure and the square structure.

Referring to FIG. 28, a pellicle including the pellicle film 110 and a supporting pattern 132 may be positioned under the mask M during the EUV lithography process. The mask M may include a mask pattern MP. The mask pattern MP may be arranged on a lower surface of the mask M. The supporting pattern 132 may be arranged adjacent to the mask pattern MP. An EUV source ES may be arranged under the mask M to irradiate the EUV toward the mask M. The EUV may be reflected from the mask M. The reflected EUV may be irradiated to a semiconductor substrate S through an optical unit OU.

Referring to FIG. 1, the supporting block 134, also referred to as an upper supporting block, may be arranged on an edge portion of the second surface 114 of the pellicle film 110. Thus, in one embodiment, the supporting block 134 may have a rectangular frame shape arranged on the edge portion of the second surface 114 of the pellicle film 110. The supporting pattern 132 may be connected to the supporting block 134. Thus, the supporting block 134 may form an outer border portion of the supporting structure 130. The supporting block 134 may have an upper surface substantially coplanar with an upper surface of the supporting patterns 132. The supporting block 134 may also have a lower surface substantially coplanar with a lower surface of the supporting patterns 132. As such, in one embodiment, the supporting block 134 may have a thickness substantially the same as a thickness of the supporting pattern 132, and may be coplanar with the supporting pattern 132.

The supporting block 134 may include a third width W3 for determining a size of a space where the supporting pattern 132 may be arranged. For example, the third width W3 of the supporting block 134 may be a distance between inner side surfaces of the supporting block 134. The third width W3 of the supporting block 134 may be shorter than the first width W1 of the opening 122. Thus, the inner side surfaces of the supporting block 134 may be located inside inner side surfaces of the opening 122 closest to the pellicle film 110.

When a pellicle is to be used in the EUV lithography process, the supporting block 134 and the pellicle film 110 may be cut along a vertical line extended from an upper end of the opening 122, e.g., a cutting line. The cutting may pass through the supporting block 134. Therefore, an edge portion of the supporting block 134, an edge portion of the pellicle film 110 and the handling block 120 outside the cutting line may be removed. In this process, the entire handling block 120 may be removed from the pellicle film 110. If the inner side surfaces of the supporting block 134 are positioned on or outside the cutting line, all of the supporting block 134 may be removed by the cutting process. When the supporting block 134 is entirely removed, the supporting pattern 132 may collapse. Thus, in one embodiment, the inner side surfaces of the supporting block 134 are located inside the inner side surfaces of the opening 122 and inside the cutting line, so that the supporting block 134 may partially exist after the cutting process to support the supporting pattern 132. As such, after the cutting process, an outer border portion of the supporting structure 130 may remain. Also, as a result of the cutting operation, an outer side surface of the pellicle film may be coplanar with an outer side surface of the supporting structure.

As mentioned above, in one embodiment, a pellicle actually used in the EUV lithography process does not include the handling block 120. Thus, the handling block 120 may be removed from the pellicle 100. If a handling structure without an opening is used and is removed by etching, the pellicle film 110 and the supporting pattern 132 may be damaged during removing the handling structure without the opening. However, in certain embodiments described herein, because the handling block 120 has the opening 122, the handling block 120 may be easily removed from the pellicle 100 by the simple cutting process without damage to the pellicle film 110 and the supporting pattern 132.

The EUV reflected from the mask M may be may be irradiated to the semiconductor substrate through the holes 133 of the supporting pattern 132 and the pellicle film 110. In order to allow the EUV to penetrate the supporting pattern 132, the supporting pattern 132 may have a restricted thickness. For example, when the supporting pattern 132 has a thickness of above 50 µm, transmissivity of the EUV through the supporting pattern 132 may be decreased. Particularly, when the thickness of the supporting pattern 132 is above 50 µm, the shape of the supporting pattern 132 may be transcribed into the layer on the semiconductor substrate. Therefore, in certain embodiments, the supporting structure 130 has a thickness of about 1 µm to about 50 µm.

The second etch stop layer 150 may be interposed between a lower surface of the supporting structure 130 and the second surface 114 of the pellicle film 110. Particularly, the second etch stop layer 150 may be interposed between lower surfaces of the supporting pattern 132 and the supporting block 134, and the second surface 114 of the pellicle film 110. The second etch stop layer 150 may have a function as to prevent the pellicle film 110 from being etched by an etching solution in an etching process for forming the supporting pattern 132. Because the supporting structure 130 may include silicon, the second etch stop layer 150 may include a material that is not removed by the wet etching solution capable of etching silicon. For example, the second etch stop layer 150 may include silicon oxide, silicon nitride, etc. Alternatively, the second etch stop layer 150 may include other materials as well as silicon oxide, silicon nitride, etc. The second etch stop layer 150 may have a thickness, for example, of about 100 nm.

FIGS. 4 to 11 are cross-sectional views illustrating an exemplary method of manufacturing the pellicle in FIG. 1 in accordance with example embodiments.

Figure 4:
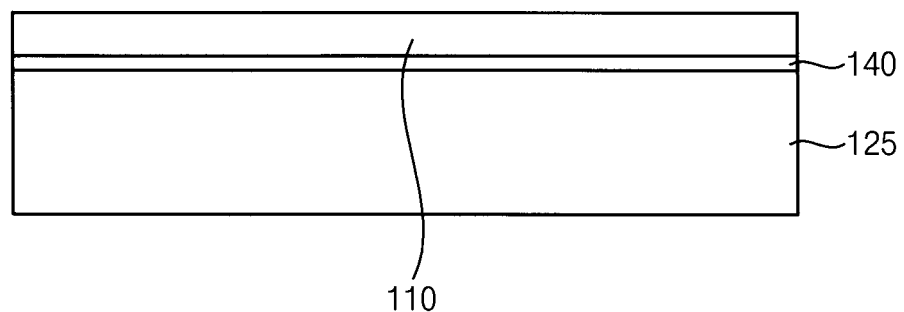

Referring to FIG. 4, the first etch stop layer 140 is formed on an upper surface of a handling member 125, also referred to as a handling structure. The handling member 125 may include, for example, silicon. The first etch stop layer 140 may include a material that is not removed by the wet etching solution capable of etching silicon. For example, the first etch stop layer 140 may include silicon oxide, silicon nitride, etc. Alternatively, the first etch stop layer 140 may include other materials as well as silicon oxide, silicon nitride, etc. The first etch stop layer 140 may have a thickness, for example, of about 100 nm.

The pellicle film 110 is formed on the upper surface of the first etch stop layer 140. The pellicle film 110 may prevent the mask from being contaminated by byproducts generated in the EUV lithography process. The pellicle film 110 may include a material for allowing the EUV to penetrate the pellicle film 110. For example, the pellicle film 110 may include silicon. Alternatively, the pellicle film 110 may include other materials for allowing the EUV to penetrate the pellicle film 110 as well as silicon. The pellicle film 110 may have a thickness of about 30 nm to about 100 nm.

Figure 5:
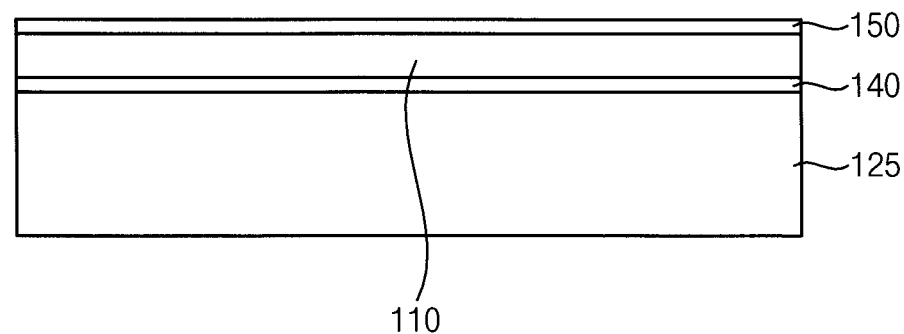

Referring to FIG. 5, the second etch stop layer 150 is formed on the second surface 114 of the pellicle film 110. The second etch stop layer 150 may include a material that may not be removed by the wet etching solution capable of etching silicon. For example, the second etch stop layer 150 may include silicon oxide, silicon nitride, etc. Alternatively, the second etch stop layer 150 may include other materials as well as silicon oxide, silicon nitride, etc. The second etch stop layer 150 may have a thickness, for example, of about 100 nm.

Figure 6:
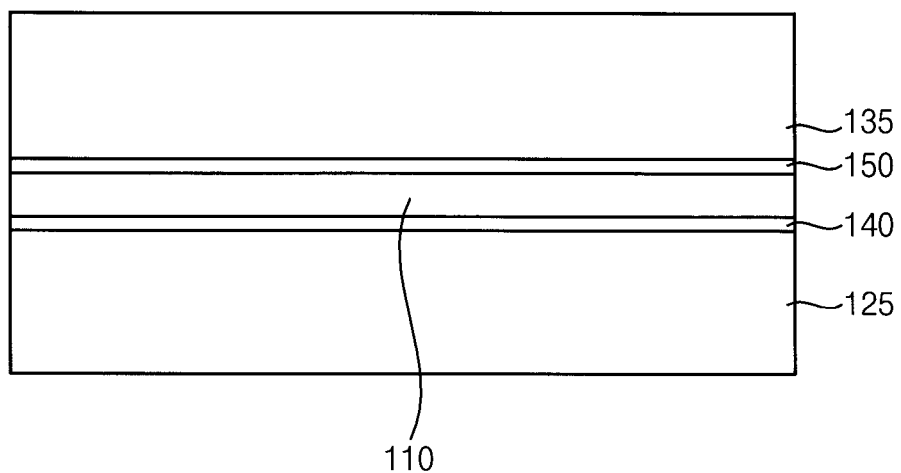

Referring to FIG. 6, a supporting member 135 may be attached to the upper surface of the second etch stop layer 150. In one embodiment, the supporting member 135 may include a material substantially the same as a material of the handling member 125. Thus, the supporting member 135 may include silicon.

Figure 7:
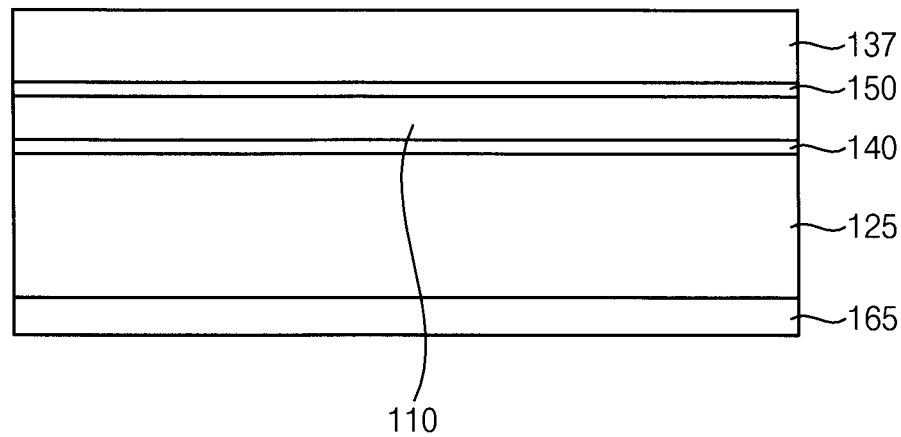

Referring to FIG. 7, an upper surface of the supporting member 135 may be removed to form a supporting layer 137. The upper surface of the supporting member 135 may be removed, for example, by a grinding process. The supporting layer 137 may have a thickness, for example, of about 1 µm to about 50 µm.

Alternatively, the supporting layer 137 having the thickness of about fpm to about 50 µm may be formed on the upper surface of the second etch stop layer 150. In this case, the process for attaching the supporting member 135 and the process for grinding the supporting member 135 may be omitted.

An etch stop layer 165 may be formed on a lower surface of the handling member 125. The etch stop layer 165 may be formed before or after performing the above-mentioned processes. The etch stop layer 165 may include, for example, silicon nitride, silicon oxide, etc.

Figure 8:
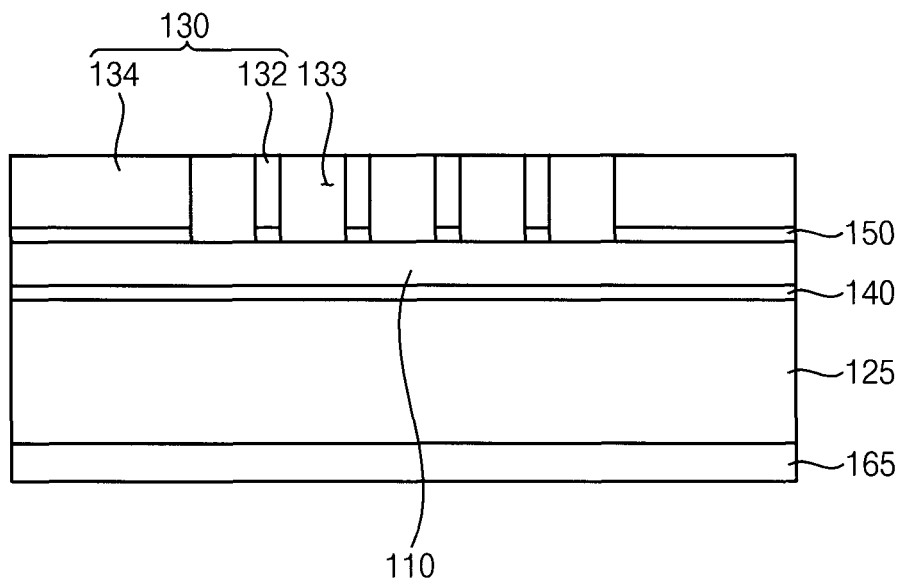

Referring to FIG. 8, the supporting layer 137 may be patterned to form the supporting structure 130 including the supporting pattern 132 and the supporting block 134. In example embodiments, an etch mask may be formed on the upper surface of the supporting layer 137. The supporting layer 137 may be etched using the etch mask to form the supporting pattern 132 having the holes 133. When the etch mask has a honeycomb mesh structure, the supporting pattern 132 having the honeycomb structure in FIG. 2 may be formed. When the etch mask has a square mesh structure, the supporting pattern 132a having the square structure in FIG. 3 may be formed. The handling member 125 may firmly support the thin pellicle film 110 during the etching process. Thus, the thin pellicle film 110 may not be damaged.

The supporting pattern 132 may be arranged on the central portion of the second surface 114 of the pellicle film 110. The EUV may pass through the holes 133 between the supporting patterns 132. The supporting block 134 may be arranged on the edge portion of the second surface 114 of the pellicle film 110. The supporting block 134 may have the third width W3 for determining the size of the space where the supporting pattern 132 is arranged. For example, the third width W3 of the supporting block 134 may be a distance between the inner side surfaces of the supporting block 134.

The second etch stop layer 150 exposed through the holes 133 of the supporting pattern 132 may be dry-etched to expose the second surface 114 of the pellicle film 110 through the holes 133 of the supporting pattern 132.

Figure 9:
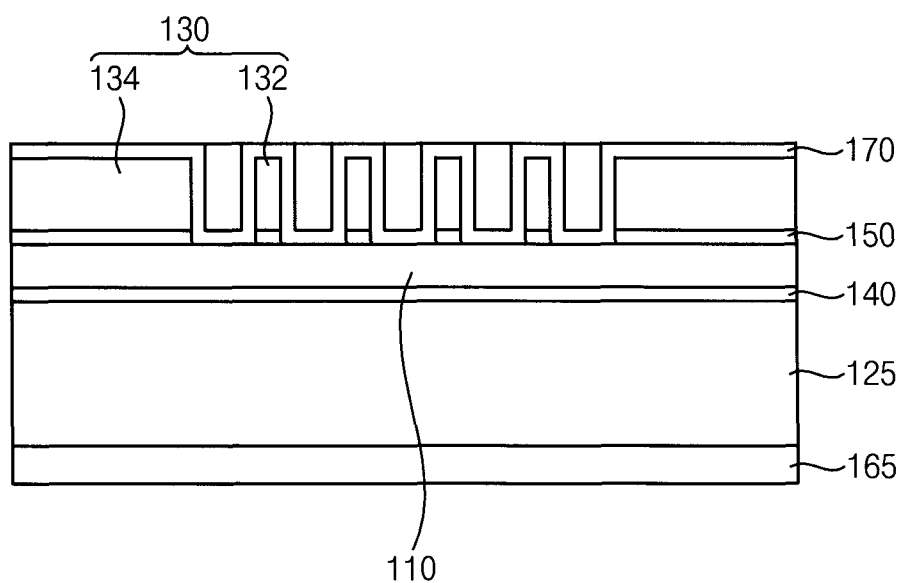

Referring to FIG. 9, a protecting layer 170 may be formed on the upper surfaces of the supporting pattern 132 and the supporting block 134. The protecting layer 170 may include, for example, a metal such as copper.

Referring to FIG. 10, the etch mask layer 165 may be dry-etched to form the etch mask 160 on the lower surface of the handling member 125. The etch mask 160 may have an opening corresponding to the central portion of the pellicle film 110 where the supporting pattern 132 may be positioned.

Referring to FIG. 11, the handling member 125 may be wet-etched using the etch mask 160 until the first etch stop layer 140 is exposed to form the handling block 120 having the opening 122. During the wet-etching process, the protecting layer 170 may protect the supporting pattern 132. Thus, the supporting pattern 132 may avoid being damaged.

The opening 122 may have the first width W1 and the second width W2. The first width W1 may be the upper width of the opening 122 for determining the exposed area of the first surface 112 of the pellicle film 110. The second width W2 may be the lower width of the opening 122 for determining the entrance area of the opening 122. The second width W2 may be wider than the first width W1. Further, the opening 122 may have a gradually decreased width from the second width W2 to the first width W1. Alternatively, the first width W1 may be substantially the same as the second width W2.

The third width W3 of the supporting block 134 may be shorter than the first width W1 of the opening 122. Thus, the inner side surfaces of the supporting block 134 may be located inside the inner side surfaces of the opening 122 toward the central portion of the pellicle film 110.

After forming the opening 122, the protecting layer 170 may be removed. Alternatively, the method of this example embodiment may not include the process for forming the protecting layer 170.

The first etch stop layer 140 exposed through the opening 122 may be dry-etched to complete the pellicle 100 in FIG. 1. The first surface 112 of the pellicle film 110 may be exposed through the opening 122.

Figure 12:
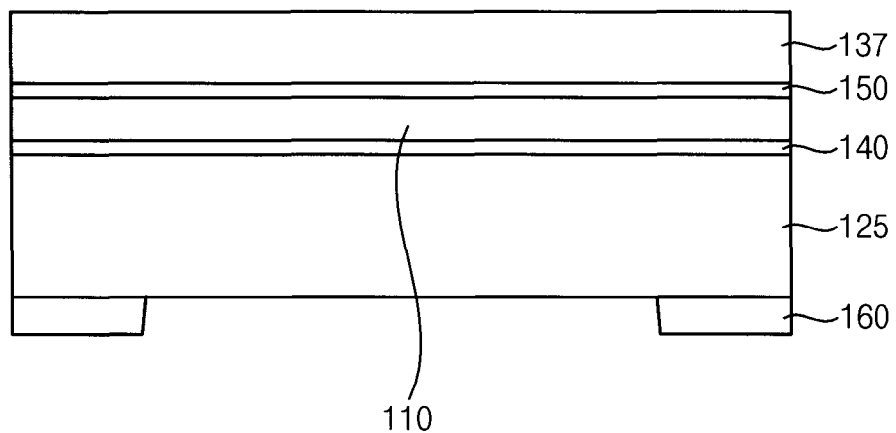
Figure 13:
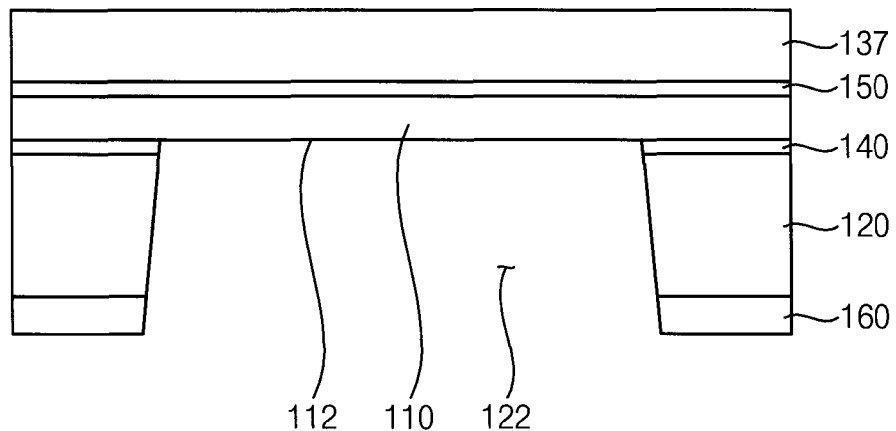
Figure 14:
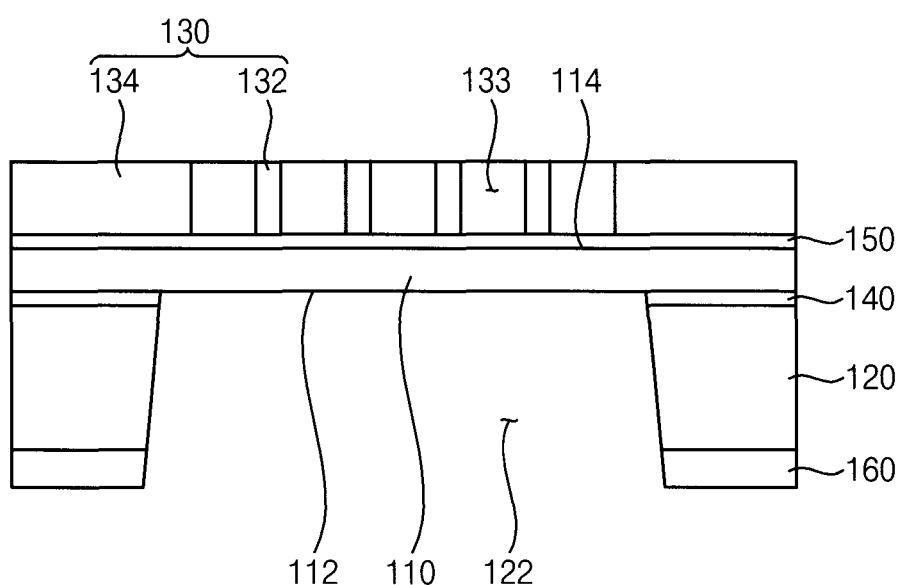

FIGS. 12 to 14 are cross-sectional views illustrating a method of manufacturing the pellicle in FIG. 1 in accordance with example embodiments.

Processes substantially the same as the processes illustrated with reference to FIGS. 4 to 7 may be performed.

Referring to FIG. 12, the etch mask layer 165 may be dry-etched to form the etch mask 160 on the lower surface of the handling member 125. The etch mask 160 may have the opening corresponding to the central portion of the pellicle film 110 where the supporting pattern 132 may be positioned.

Referring to FIG. 13, the handling member 125 may be wet-etched using the etch mask 160 until the first etch stop layer 140 is exposed to form the handling block 120 having the opening 122.

The first etch stop layer 140 exposed through the opening 122 may be dry-etched. The first surface 112 of the pellicle film 110 may be exposed through the opening 122. During the etching processes, the supporting layer 137 may firmly support the pellicle film 110. Thus, the pellicle film 110 may avoid being damaged.

Referring to FIG. 14, the supporting layer 137 may be patterned to form the supporting structure 130 including the supporting pattern 132 and the supporting block 134. In example embodiments, an etch mask may be formed on the upper surface of the supporting layer 137. The supporting layer 137 may be etched using the etch mask to form the supporting pattern 132 having the holes 133. When the etch mask has a honeycomb structure, the supporting pattern 132 having the honeycomb mesh structure in FIG. 2 may be formed. When the etch mask has a square mesh structure, the supporting pattern 132a having the square mesh structure in FIG. 3 may be formed. The handling member 135 may firmly support the thin pellicle film 110 during the etching process. Thus, the thin pellicle film 110 may avoid being damaged.

The second etch stop layer 150 exposed through the holes 133 of the supporting pattern 132 may be dry-etched to complete the pellicle 100 in FIG. 1. The second surface 114 of the pellicle film 110 may be exposed through the holes 133 of the supporting pattern 132.

Figure 15:
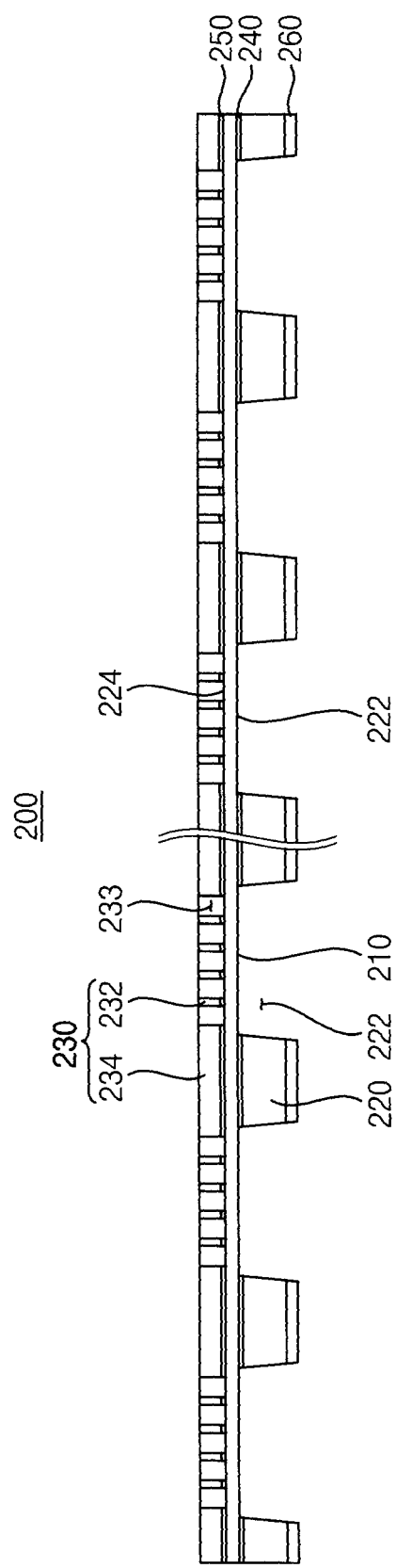

FIG. 15 is a cross-sectional view illustrating a pellicle for an EUV lithography in accordance with example embodiments.

Referring to FIG. 15, a pellicle 200 for an EUV lithography in accordance with this example embodiment may include a wafer level structure. The pellicle 200 may include a pellicle film 210, a handling structure 220, supporting structures 230, first etch stop layers 240, second etch stop layers 250 and an etch mask 260.

The handling structure 220 may have openings 222 configured to expose a first surface 212 of the pellicle film 210. The handling structure 220 may be cut along scribe lanes of the handling structure 220 to form the handling blocks 120 in FIG. 1. Thus, further illustrations with respect to the handling structure 220 are omitted herein for brevity. The handling structure 220 may include a bare wafer. For example, the bare wafer may be a wafer that has not previously been etched, grinded, planarized, or patterned.

The pellicle film 210 may be formed on an entire upper surface of the handling structure 220. The pellicle film 210 may have a structure substantially the same as the structure of the pellicle film 110 in FIG. 1. Thus, any further illustrations with respect to the pellicle film 210 may be omitted herein for brevity.

Each of the supporting structures 230 may include a supporting pattern 232 and a supporting block 234. The supporting pattern 232 may have a plurality of holes 233 configured to expose a second surface 214 of the pellicle film 210. The supporting structures 230 may be formed, for example, from a single supporting substrate. The supporting substrate may include a bare wafer. Each of the supporting structures 230 may have a structure substantially the same as the structure of the supporting structure 130 in FIG. 1. Thus, any further illustrations with respect to the supporting structures 230 may be omitted herein for brevity.

The first etch stop layers 240, the second etch stop layers 250 and the etch mask 260 may have structures substantially the same as the structures of the first etch stop layer 140, the second etch stop layer 150 and the etch mask 160, respectively, in FIG. 1. Thus, any further illustrations with respect to the first etch stop layers 240, the second etch stop layers 250 and the etch mask 260 may be omitted herein for brevity.

FIGS. 16 to 23 are cross-sectional views illustrating a method of manufacturing the pellicle in FIG. 15 in accordance with example embodiments.

Figure 16:
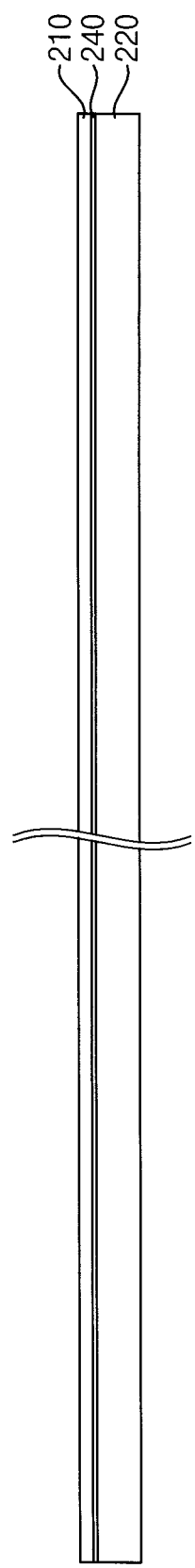

Referring to FIG. 16, the first etch stop layer 240 is formed on the upper surface of the handling substrate 220. The first etch stop layer 240 may include silicon oxide, silicon nitride, etc. The first etch stop layer 240 may have a thickness of about 100 nm. The handling substrate 220 may include a bare wafer.

The pellicle film 210 may be formed on the upper surface of the first etch stop layer 240. The pellicle film 210 may include, for example, silicon. The pellicle film 210 may have a thickness of about 30 nm to about 100 nm.

Figure 17:
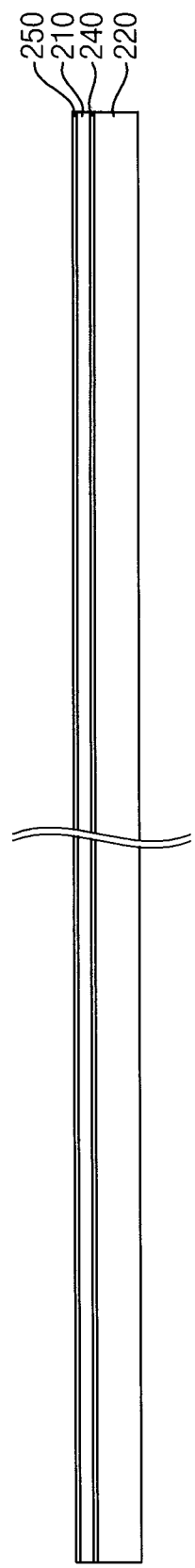

Referring to FIG. 17, the second etch stop layer 250 may be formed on the upper surface of the pellicle film 210. The second etch stop layer 250 may include silicon oxide, silicon nitride, etc. The second etch stop layer 250 may have a thickness, for example, of about 100 nm.

Figure 18:
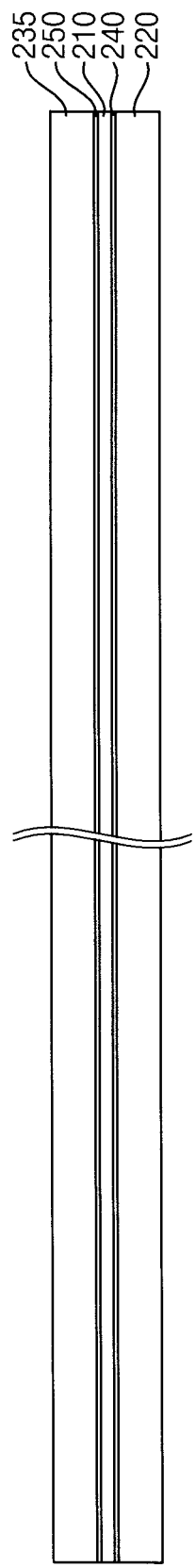

Referring to FIG. 18, the supporting substrate 235 may be attached to the upper surface of the second etch stop layer 250. The supporting substrate 235 may include a material substantially the same as a material of the handling substrate 220. Thus, the supporting substrate 235 may include a bare wafer. The structure in FIG. 18 may correspond to a dual silicon-on-insulator (SOI) structure including the pellicle film 210, the handling substrate 220 and the supporting substrate 235. The handling substrate 220 and the supporting substrate 235 may have substantially the same structure. The handling substrate 220 and the supporting substrate 235 may be positioned at the opposite side surfaces of the pellicle film 210.

Figure 19:
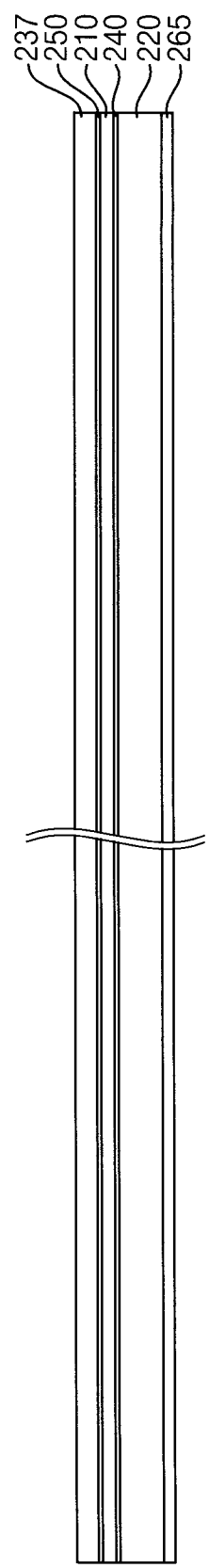

Referring to FIG. 19, an upper surface of the handling substrate 235 may be removed to form a supporting layer 237. The upper surface of the handling substrate 235 may be removed, for example, by a grinding process. The supporting layer 237 may have a thickness, for example, of about 1 μm to about 50 μm.

Alternatively, the supporting layer 237 having the thickness of about fpm to about 50 μm may be formed on the upper surface of the second etch stop layer 250. In this case, the process for attaching the supporting substrate 235 and the process for grinding the supporting substrate 235 may be omitted.

An etch stop layer 265 may be formed on a lower surface of the handling substrate 220. The etch stop layer 265 may be formed before or after performing the above-mentioned processes.

Figure 20:
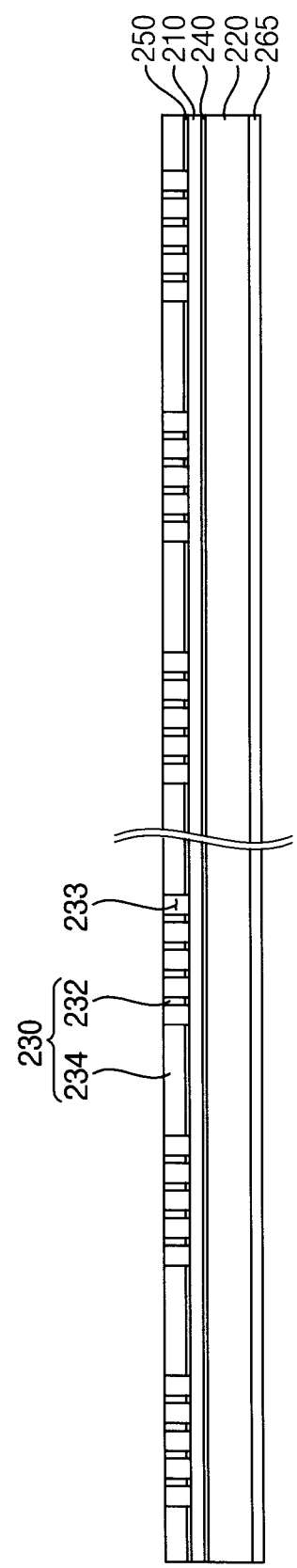

Referring to FIG. 20, the supporting layer 237 may be patterned to form the supporting structures 230 including the supporting pattern 232 and the supporting block 234. In example embodiments, an etch mask may be formed on the upper surface of the supporting layer 237. The supporting layer 237 may be etched using the etch mask to form the supporting pattern 232 having the holes 233.

The second etch stop layer 250 exposed through the holes 233 of the supporting pattern 232 may be dry-etched to expose the second surface 214 of the pellicle film 210 through the holes 233 of the supporting pattern 232.

Figure 21:
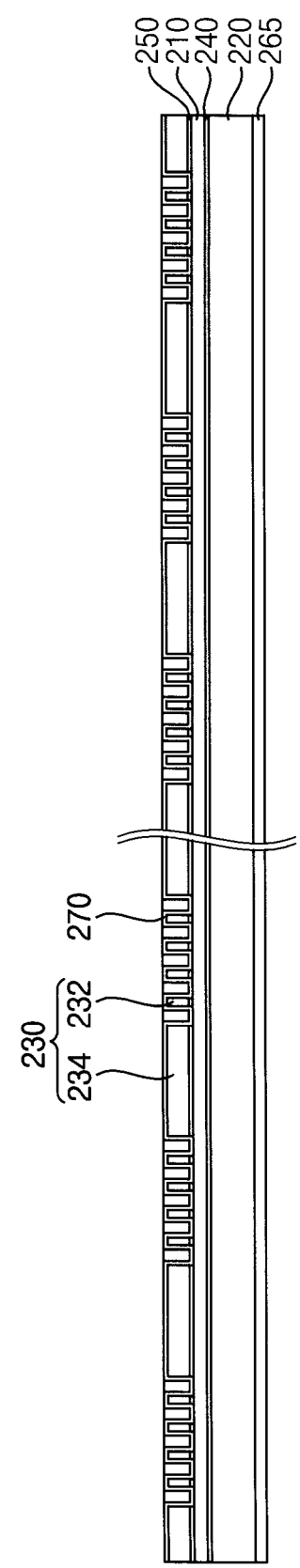

Referring to FIG. 21, a protecting layer 270 may be formed on the upper surfaces of the supporting pattern 232 and the supporting block 234. The protecting layer 270 may include, for example, a metal such as copper.

Figure 22:
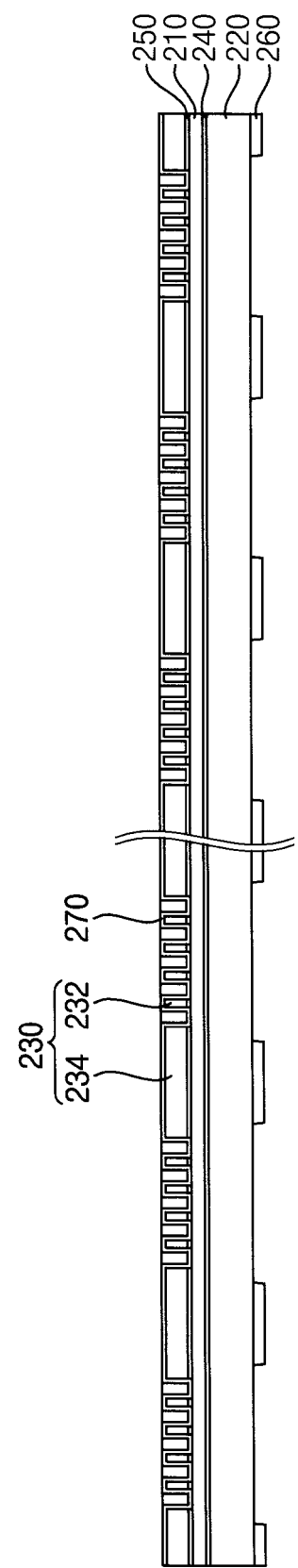

Referring to FIG. 22, the etch mask layer 265 may be dry-etched to form the etch mask 260 on the lower surface of the handling substrate 220. The etch mask 260 may have an opening corresponding to the central portion of the pellicle film 210 where the supporting pattern 232 may be positioned.

Figure 23:
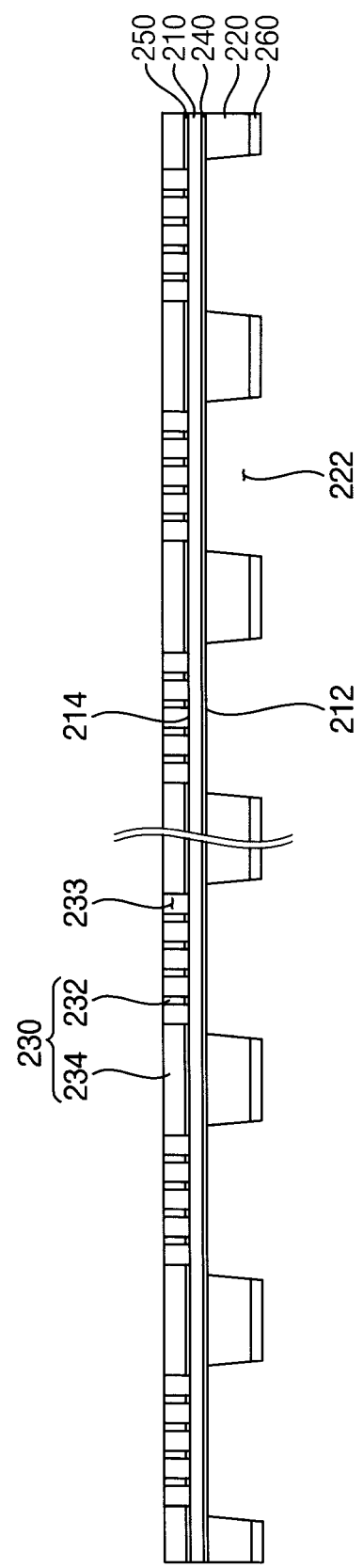

Referring to FIG. 23, the handling substrate 220 may be wet-etched using the etch mask 260 until the first etch stop layer 240 is exposed to form the openings 222.

After forming the openings 222, the protecting layer 270 may be removed. Alternatively, the method of this example embodiment may not include the process for forming the protecting layer 270.

The first etch stop layer 240 exposed through the openings 222 may be dry-etched to complete the pellicle 200 in FIG. 15. The first surface 212 of the pellicle film 210 may be exposed through the openings 222. The pellicle 200 may be cut along the cutting lines to form the plurality of pellicles 200 used in the actual EUV lithography process. Each of those pellicles 200 may then be handled using the handling blocks 220, and may further be cut along the cutting lines shown, for example, in FIG. 1, to remove the handling blocks 220.

Figure 24:
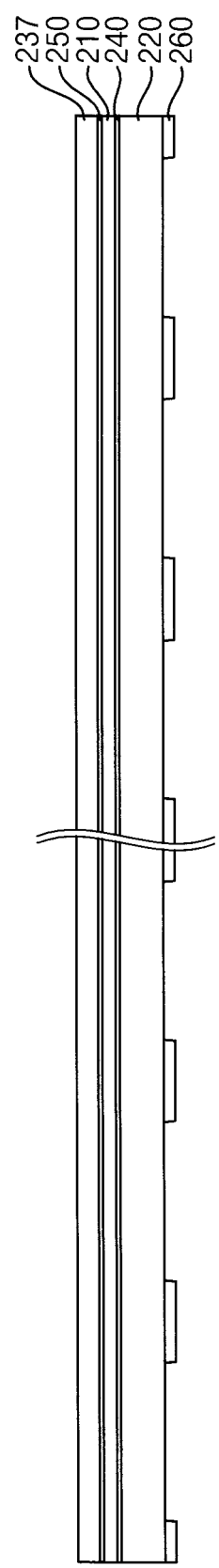
Figure 25:
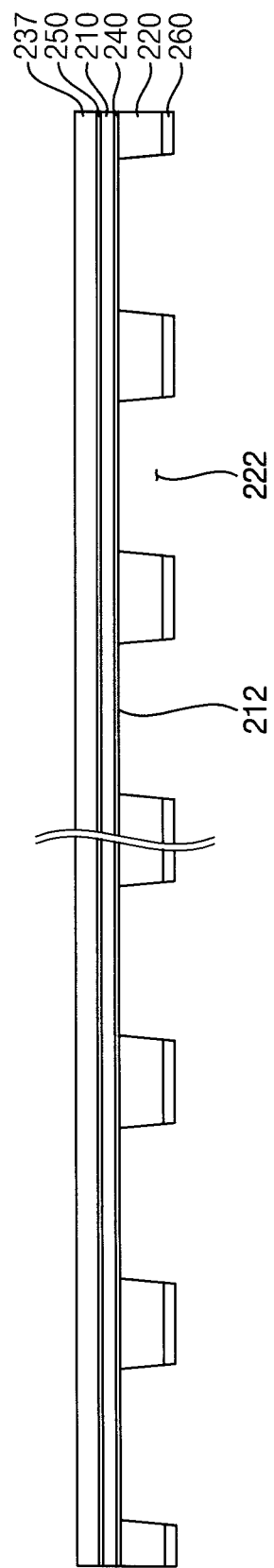
Figure 26:
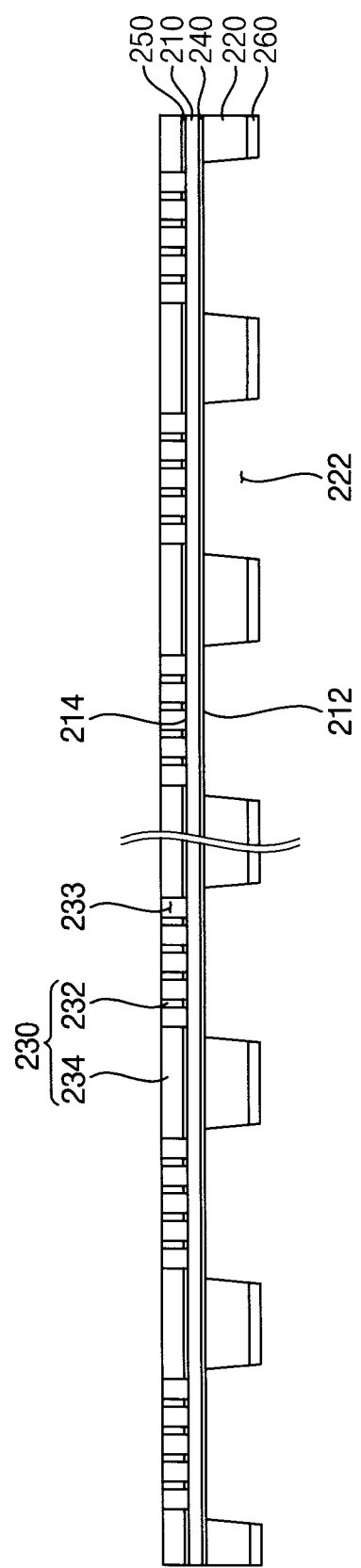

FIGS. 24 to 26 are cross-sectional views illustrating a method of manufacturing the pellicle in FIG. 15 in accordance with example embodiments.

Processes substantially the same as the processes illustrated with reference to FIGS. 16 to 19 may be performed.

Referring to FIG. 24, the etch mask layer 265 may be dry-etched to form the etch mask 260 on the lower surface of the handling substrate 220.

Referring to FIG. 25, the handling substrate 220 may be wet-etched using the etch mask 260 until the first etch stop layer 240 is exposed to form the openings 222.

The first etch stop layer 240 exposed through the openings 222 may be dry-etched. The first surface 212 of the pellicle film 210 may be exposed through the openings 222.

Referring to FIG. 26, the supporting layer 237 may be patterned to form the supporting structures 230 including the supporting pattern 232 and the supporting block 234. In example embodiments, an etch mask may be formed on the upper surface of the supporting layer 237. The supporting layer 237 may be etched using the etch mask to form the supporting patterns 232 having the holes 233.

The second etch stop layer 250 exposed through the holes 233 of the supporting pattern 232 may be dry-etched to complete the pellicle 200 in FIG. 15. The second surface 214 of the pellicle film 210 may be exposed through the holes 233 of the supporting pattern 232. The pellicle 200 may be cut along the cutting lines to form the plurality of pellicles 200 used in the actual EUV lithography process. Each of those pellicles 200 may then be handled using the handling blocks 220, and may further be cut along the cutting lines shown, for example, in FIG. 1, to remove the handling blocks 220.

Figure 27:
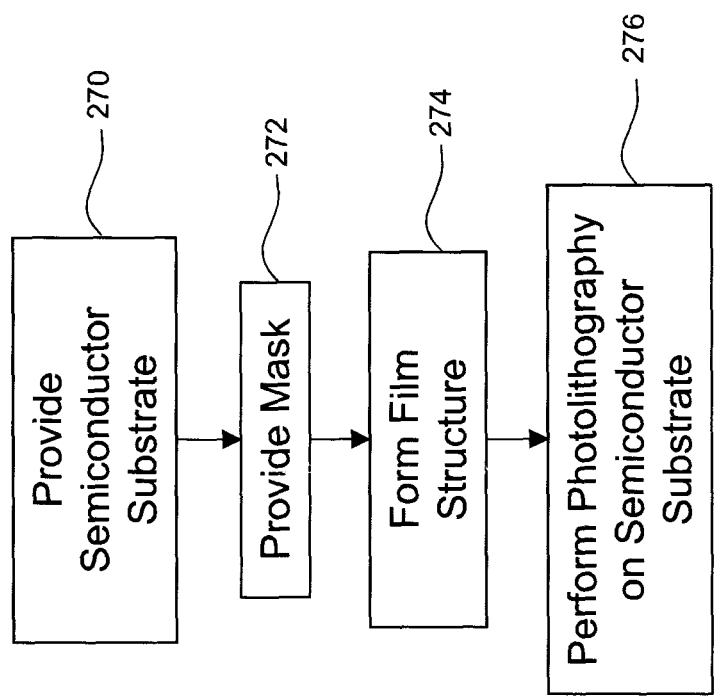

FIG. 27 depicts an exemplary method of manufacturing a semiconductor device, according to exemplary embodiments. As shown in FIG. 27, in step 270, a semiconductor substrate is provided. For example, a semiconductor wafer may be provided by placing the wafer on a platform. The wafer may include a plurality of repeated patterns that are used to form a plurality of semiconductor chips.

In step 272, a mask is provided. The mask may be provided, for example, above the semiconductor substrate. The mask may have a structure that forms certain patterns used for photolithography.

In Step 274, a film structure is formed. Forming the film structure may include, for example, some of the steps described above in connection with the various embodiments. For example, forming the film structure may include: providing a pellicle film having a plate shape that includes a first surface and a second surface opposite the first surface, forming a supporting structure on the first surface of the pellicle film, the supporting structure having a having a mesh pattern, forming a handling structure on the second surface of the pellicle film, the handling structure including a handling substrate with an opening formed therethrough, and removing the handling structure from the pellicle film by performing a cutting operation. As an additional step, prior to performing the cutting operation, the film structure can be moved using the handling structure, for example by a robot device. In one embodiment, after the cutting operation is performed, the film structure may be aligned with the mask.

In step 276, the mask and the film structure are used to perform a photolithography process to form patterns on the semiconductor substrate. After the patterns are formed, additional steps may be performed that result in the formation of a semiconductor chip on the semiconductor substrate. The semiconductor chip can be removed (e.g., singulated) from the wafer, and can then be placed in a package or other electronic device.

It should be noted that certain steps shown in FIG. 27 are depicted as occurring in a particular order, but such an order is not required. For example, the steps of providing the semiconductor substrate, providing the mask, and forming the film structure can be performed in any order and/or at the same time with respect to each other.

Figure 29:
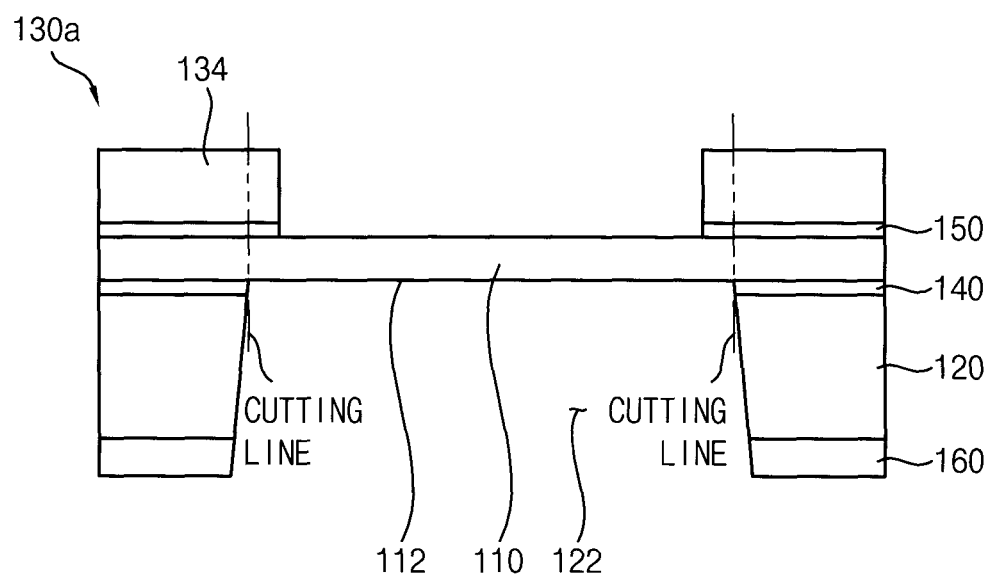
FIG. 29 is a cross-sectional view illustrating a pellicle for an EUV lithography in accordance with example embodiments.

FIG. 29 is a cross-sectional view illustrating a pellicle for an EUV lithography in accordance with example embodiments.

A pellicle 100a of this example embodiment may include elements substantially the same as those of the pellicle 100 in FIG. 1 except for a supporting structure. Thus, the same reference numerals may refer to the same elements and any further illustrations with respect to the same elements may be omitted herein for brevity.

Referring to FIG. 28, a supporting structure 130a of this example embodiment may not include the supporting pattern 132 in FIG. 1. Thus, the supporting structure 130a may include only the supporting block 134. The supporting block 134 may support the pellicle film 110.

According to example embodiments, a pellicle may include a handling block having a relatively thick thickness configured to support the pellicle film having a relatively thin thickness (e.g., thinner than the thickness of the handling block). Further, the handling block may be readily formed from the handling substrate. Thus, the pellicle may be handled using the thick handling block, not the thin pellicle film, so that the thin pellicle film may avoid being damaged. In addition, the handling block can then be easily cut from the pellicle film before being used for photolithography. As a result, the pellicle may protect the mask from byproducts generated in the EUV lithography process so that the mask is not contaminated.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method, comprising:
   providing a semiconductor substrate;
   providing a mask above the semiconductor substrate;
   forming a film structure, including:
   providing a pellicle film having a plate shape that includes a first surface and a second surface opposite the first surface,
   forming a supporting structure on the first surface of the pellicle film, the supporting structure having a having a mesh pattern,
   forming a handling structure on the second surface of the pellicle film, the handling structure including a handling substrate with an opening formed therethrough, and
   removing the handling structure from the pellicle film by performing a cutting operation; and
   transmitting ultraviolet light through the mask and the film structure to form patterns on the semiconductor substrate.

2. The method of claim 1, wherein:
   as a result of the cutting operation, an outer side surface of the pellicle film is coplanar with an outer side surface of the supporting structure.

3. The method of claim 1, further comprising:
   prior to forming the handling structure on the second surface of the pellicle film, forming an etch stop layer on the second surface of the pellicle film.

4. The method of claim 3, further comprising:
   after forming the etch stop layer on the second surface of the pellicle film, forming the handling substrate on the etch stop layer.

5. The method of claim 4, further comprising:
   forming the opening in the handling substrate by performing wet etching; and
   removing a portion of the etch stop layer formed that corresponds to the opening by performing dry etching.

6. The method of claim 1, wherein:
   prior to the cutting operation, the supporting structure includes a plurality of holes separated by portions of the mesh pattern, and a supporting block surrounding the mesh structure and holes, and
   the cutting operation cuts through the supporting block.

7. The method of claim 6, wherein:
   prior to the cutting, a width between opposite inner side surfaces of the supporting block is shorter than a width of the opening.

8. The method of claim 1, further comprising:
   prior to removing the handling structure, moving the pellicle film and supporting structure by handling the handling structure.

9. The method of claim 1, wherein the pellicle film has a thickness of about 30 nm to about 100 nm.

10. The method of claim 1, wherein the pellicle film comprises silicon.

11. The pellicle of claim 1, wherein the supporting structure has a thickness of about 1 µm to about 50 µm.

12. The method of claim 1, wherein the semiconductor substrate is a wafer, and further comprising:
 after performing the photolithography process, cutting the wafer to form a plurality of semiconductor chips.

13. A photolithography method comprising:
 providing a semiconductor substrate;
 providing a mask above the semiconductor substrate;
 providing a pellicle film having a plate shape that includes a first surface and a second surface opposite the first surface;
 forming an upper supporting structure on the first surface of the pellicle film, the upper supporting structure having a mesh pattern;
 forming a lower supporting structure on the second surface of the pellicle film;
 forming an opening in the lower supporting structure to form a lower supporting block; and
 transmitting ultraviolet through the mask and through the pellicle film to form patterns on the semiconductor substrate.

14. The photolithography method of claim 13, further comprising:
 moving the pellicle film and upper supporting structure by handling the lower supporting block; and
 after the moving, removing the lower supporting block from the pellicle film by performing a cutting operation.

15. The photolithography method of claim 13, wherein the mesh pattern has a honeycomb or square pattern.

16. A method of manufacturing a semiconductor device, the method including:
 providing a semiconductor substrate;
 providing a mask above the semiconductor substrate;
 forming a film structure, the film structure including:
 a pellicle film having a plate shape that includes a first surface and a second surface opposite the first surface,
 a supporting structure on the first surface of the pellicle film, the supporting structure having a pattern that includes an array of holes, and
 a handling substrate on the second surface of the pellicle film, the handling substrate having an opening therethrough; and
 transmitting ultraviolet light through the mask and through the pellicle film to form patterns on the semiconductor substrate.

17. The method of claim 16, wherein the supporting structure includes a mesh pattern.

18. The method of claim 16, further comprising:
 removing the handling substrate from the pellicle film by using a cutting process.

19. The method of claim 16, wherein:
 the pellicle film has a thickness of about 30 nm to about 100 nm, and
 the supporting structure has a thickness of about 1 µm to about 50 µm.

* * * * *